US012687390B2

(12) United States Patent
Fulford et al.

(10) Patent No.: US 12,687,390 B2
(45) Date of Patent: Jul. 21, 2026

(54) APPARATUS AND METHOD FOR DETERMINING THE SURFACE PROFILE OF A SEMICONDUCTOR SUBSTRATE USING A LASER SCANNING TECHNIQUE

(71) Applicant: Tokyo Electron Limited, Tokyo (JP)

(72) Inventors: Daniel J. Fulford, Albany, NY (US); Mark I. Gardner, Austin, TX (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 18/605,995

(22) Filed: Mar. 15, 2024

(65) Prior Publication Data

US 2025/0290745 A1 Sep. 18, 2025

(51) Int. Cl.
G01B 11/25 (2006.01)
H10P 72/00 (2026.01)

(52) U.S. Cl.
CPC ...... G01B 11/2522 (2013.01); H10P 72/0616 (2026.01)

(58) Field of Classification Search
CPC .. G01B 11/24; G01B 11/2441; G01B 9/0209; G01B 2290/70; G01B 9/02084; G01B 11/0675; G01B 9/02057; G01B 9/02088; G01B 21/20; G01B 11/30; G01B 11/00; G01B 9/02072; G01B 11/22; G01B 11/306; G01B 9/0201; G01B 11/2513; G01B 9/02; G01B 9/02091; G01B 11/303; G01B 21/30; G01B 21/045; G01B 2290/50;

(Continued)

(56) References Cited

U.S. PATENT DOCUMENTS 4,289,400 A 9/1981 Kubota et al.
4,689,491 A 8/1987 Lindow et al.
(Continued)

FOREIGN PATENT DOCUMENTS

CN 103189714 A * 7/2013 ......... G01B 11/2513
CN 211669102 U * 10/2020
(Continued)

OTHER PUBLICATIONS

Capas, "Development of an off-Line Silicon Wafer Warpage Measuring Tool", Master of Science Thesis, KTH Industrial Engineering and Management, 2021, 74 pgs.

(Continued)

*Primary Examiner* — Michael P Stafira
(74) *Attorney, Agent, or Firm* — Egan, Enders & Huston LLP.

(57) ABSTRACT

Systems and methods are provided herein for determining the planarity of a semiconductor substrate. The systems and methods described herein use a metrology tool that utilizes a non-contact, laser-scanning technique to determine the planarity a semiconductor substrate. The metrology tool disclosed herein uses a fixed optical system to measure the slope of the substrate surface at multiple points across the substrate surface as the semiconductor substrate is moved in at least one direction (e.g., an x and/or y direction). The slope measurements obtained across the substrate surface are then combined to determine a surface profile of the semiconductor substrate, or used to calculate the amount of bow or warp attributed to the substrate surface.

20 Claims, 8 Drawing Sheets

(58) Field of Classification Search

CPC ...... G01B 11/03; G01B 5/0037; G01B 11/02; G01B 11/0608; G01B 11/25; G01B 9/0207; G01B 9/02083; G01B 11/245; G01B 11/2522; G01B 2210/56; G01B 11/026; G01B 9/02027; G01B 11/26; G01B 21/042; G01B 11/254; G01B 15/04; G01B 17/00; G01B 2290/45; G01B 11/06; G01B 11/0616; G01B 11/255; G01B 21/047; G01B 21/08; G01B 21/22; G01B 11/2509; G01B 5/0002; G01B 7/34; G01B 9/02063; G01B 11/005; G01B 11/2545; G01B 11/272; G01B 5/20; G01B 7/28; G01B 9/02021; G01B 9/02043; G01B 9/02048; G01B 9/04; G01B 11/002; G01B 11/2408; G01B 7/008; G01B 7/023; G01B 9/02044; G01B 9/02061; G01B 9/02076; G01B 11/0641; G01B 11/2425; G01B 11/2527; G01B 9/02032; G01B 11/024; G01B 11/105; G01B 17/06; G01B 2210/52; G01B 5/0025; G01B 9/02085; G01B 11/065; G01B 11/08; G01B 11/12; G01B 11/2433; G01B 11/2518; G01B 17/02; G01B 2290/20; G01B 5/0014; G01B 9/02004; G01B 9/02015; G01B 11/14; G01B 11/16; G01B 11/167; G01B 11/2504; G01B 11/27; G01B 17/08; G01B 21/00; G01B 21/04; G01B 2290/30; G01B 5/0004; G01B 5/012; G01B 5/28; G01B 5/285; G01B 7/08; G01B 7/085; G01B 7/13; G01B 7/148; G01B 7/16; G01B 7/284; G01B 9/02007; G01B 9/02011; G01B 9/02024; G01B 9/02051; G01B 9/02079; G01B 9/02098; G01B 1/00; G01B 11/0633; G01B 11/161; G01B 11/168; G01B 11/2416; G01B 11/2536; G01B 15/00; G01B 15/02; G01B 15/08; G01B 2210/50; G01B 2210/54; G01B 2290/60; G01B 3/008; G01B 5/004; G01B 5/008; G01B 5/02; G01B 5/24; G01B 7/14; G01B 7/281; G01B 9/02002; G01B 9/02009; G01B 9/02038; G01B 9/02042; G01B 9/02059; G01B 9/02065; G01B 9/02081; G01B 9/02096; G01B 9/02097

See application file for complete search history.

(56) References Cited

U.S. PATENT DOCUMENTS

| | | | | |
|---|---|---|---|---|
| 5,227,641 | A | 7/1993 | Cheng | |
| 5,233,201 | A | 8/1993 | Cheng | |
| 6,433,876 | B1 * | 8/2002 | Kuhn | G01B 9/04 |
| | | | | 356/520 |
| 6,608,689 | B1 | 8/2003 | Wei et al. | |
| 6,678,055 | B2 | 1/2004 | Du-Nour et al. | |
| 7,084,979 | B1 * | 8/2006 | Aiyer | G01B 11/0608 |
| | | | | 356/369 |
| 8,534,135 | B2 | 9/2013 | Johnson et al. | |
| 10,352,691 | B1 * | 7/2019 | Chen | G01B 11/2441 |
| 12,276,922 | B2 * | 4/2025 | Fulford | C23C 16/52 |
| 2010/0085855 | A1 * | 4/2010 | Yoshida | G11B 20/1883 |
| | | | | 369/53.41 |
| 2011/0265578 | A1 * | 11/2011 | Johnson | G01L 5/0047 |
| | | | | 73/800 |
| 2014/0071457 | A1 * | 3/2014 | Cai | G01N 21/956 |
| | | | | 356/498 |
| 2014/0233040 | A1 * | 8/2014 | Gergen | G01B 11/0608 |
| | | | | 356/609 |
| 2014/0268172 | A1 * | 9/2014 | Salehpour | G01B 11/303 |
| | | | | 356/511 |
| 2015/0055141 | A1 * | 2/2015 | Cai | H01L 21/67288 |
| | | | | 356/244 |
| 2018/0003484 | A1 * | 1/2018 | Goodwin | G01B 9/02032 |
| 2022/0057323 | A1 * | 2/2022 | Egan | G01N 21/55 |
| 2022/0074869 | A1 | 3/2022 | Arora et al. | |
| 2023/0050442 | A1 * | 2/2023 | Chu | B24B 9/065 |

FOREIGN PATENT DOCUMENTS

| | | | | |
|---|---|---|---|---|
| DE | 112017000384 | T5 * | 9/2018 | G01N 21/211 |
| KR | 101941579 | B1 * | 1/2019 | G01B 11/2518 |
| WO | WO-03106925 | A1 * | 12/2003 | G01B 11/24 |
| WO | WO-2007000730 | A1 * | 1/2007 | G06T 7/50 |
| WO | WO-2022081178 | A1 * | 4/2022 | G01B 11/2441 |
| WO | 2023212180 | | 11/2023 | |
| WO | WO-2024217800 | A1 * | 10/2024 | G03F 7/7085 |

OTHER PUBLICATIONS

KLA, "Wafer Geometry And Nanotopography Metrology System" PWG5, Rev. 1, 2020, 4 pgs.

Vitrek, "Measure Wafer Bow, Warp and TTV With Capacitance", 2023, 2 pgs.

Frontier Semiconductor, "Thin Film Stress Measurement System", Model: FSM 128-NT Film, Obtained From Internet Feb. 2024, 2 pgs.

Kang, "Wafer Bow Metrology System", U.S. Appl. No. 63/592,914, filed Oct. 24, 2023, 12 pgs.

* cited by examiner

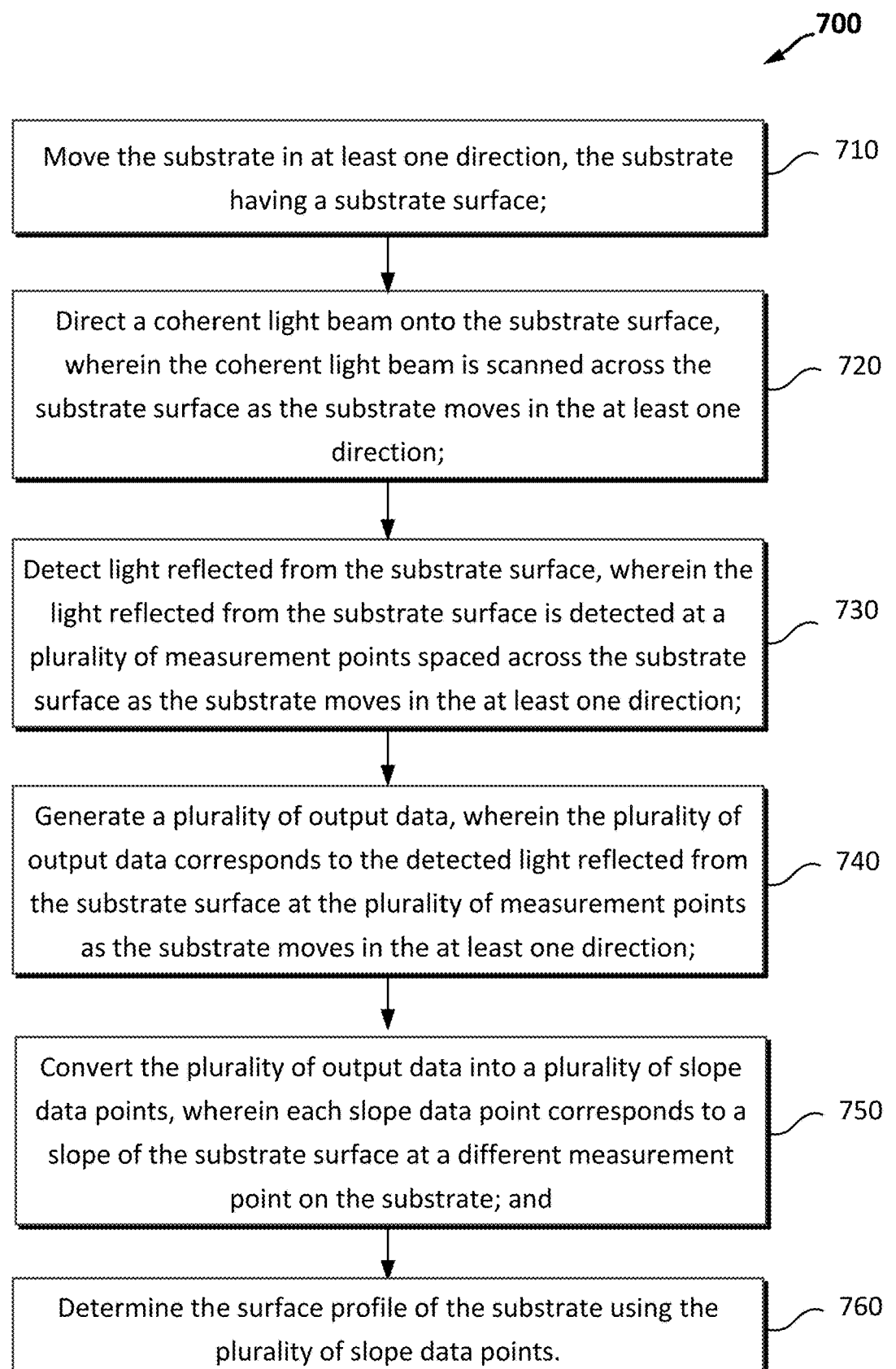

Move the substrate in at least one direction, the substrate having a substrate surface; — 710

Direct a coherent light beam onto the substrate surface, wherein the coherent light beam is scanned across the substrate surface as the substrate moves in the at least one direction; — 720

Detect light reflected from the substrate surface, wherein the light reflected from the substrate surface is detected at a plurality of measurement points spaced across the substrate surface as the substrate moves in the at least one direction; — 730

Generate a plurality of output data, wherein the plurality of output data corresponds to the detected light reflected from the substrate surface at the plurality of measurement points as the substrate moves in the at least one direction; — 740

Convert the plurality of output data into a plurality of slope data points, wherein each slope data point corresponds to a slope of the substrate surface at a different measurement point on the substrate; and — 750

Determine the surface profile of the substrate using the plurality of slope data points. — 760

*FIG. 7*

APPARATUS AND METHOD FOR DETERMINING THE SURFACE PROFILE OF A SEMICONDUCTOR SUBSTRATE USING A LASER SCANNING TECHNIQUE

BACKGROUND

The present disclosure relates to the semiconductor fabrication, and more particularly, to systems, metrology tools and methods for measuring a surface profile of a semiconductor substrate.

Semiconductor fabrication generally begins with a flat semiconductor substrate (e.g., a semiconductor wafer, W), such as that illustrated in FIG. 1(A). During fabrication of the semiconductor substrate, multiple processing steps are executed to form structures on material layers formed on the semiconductor substrate. These processing steps can include depositing material on the substrate, exposing the substrate to actinic radiation, removing material from the substrate, implanting dopants, annealing, baking, and so forth. The different materials and structural formations can cause internal stresses in the substrate which may result in bowing of the wafer, warping of the wafer or difference in wafer thickness.

FIG. 1(B) illustrates a first order bowing of a semiconductor substrate (W). Wafer bow is defined as the deviation of the center point of the median surface (i.e., the locus of points in the substrate equidistant between the front and back surfaces) of a free, unclamped substrate W from a reference plane. As shown in FIG. 1(B), the bow measurement (d) is a z-height deviation between the median surface of the substrate W and the reference plane. The bow measurement can be a positive value when compressive forces cause a positive wafer bow, or a negative value when tensile forces cause a negative wafer bow.

FIG. 1(C) illustrates a second order bowing or warping of a semiconductor substrate (W). Warping is defined as the differences between the maximum distance ($d_{max}$) and minimum distance ($d_{min}$) of the median surface of a free, unclamped substrate W from a reference plane. As shown in FIG. 1(C), the measurements $d_{max}$ and $d_{min}$ identify positive and negative z-height deviations, respectively, between the median surface of the substrate W and the reference plane. By looking at the entire substrate surface, the warp provides a more useful measurement of true wafer shape.

The planarity of wafers used to manufacture integrated circuits (ICs) is controlled to tight tolerances to ensure that the substrates are sufficiently flat for lithographic processing. Variations in substrate planarity must be smaller than the depth of focus of optical lithography exposure tools over the illuminated region of the top surface of the substrate. To ensure a substrate remains in the depth of focus of the lithography process being used, it is necessary to measure the substrate planarity to ensure the upper surface of the substrate is substantially flat and within the specification of the optical lithography system being used, since bowing or warping of the substrate could result in defective IC patterns which raise costs through scrap and wasted time.

Laser interferometry is a method commonly used to measure substrate planarity. Laser interferometry is a measurement technique that directs laser light to the substrate and measures the changes in the wavelength of light reflected from the substrate surface. In laser interferometry, a beam splitter is used to split a laser beam into two separate beams. One beam is directed to the substrate, while the other beam is directed to a reference mirror. Both beams are reflected back to the beam splitter, where they recombine to create an interference pattern, which is detected by a photodetector. By analyzing the interference pattern detected by the photodetector, laser interferometry can measure the degree of bowing or warping in the substrate. For example, if the substrate is warped, the reflected light waves will have traveled slightly different distances, resulting in a shift in the interference pattern. While laser interferometry is useful for detecting defects in the substrate, or ensuring the substrate meets certain specifications for use in electronic devices, laser interferometry is expensive and time consuming.

A need, therefore, remains for alternative methods for measuring substrate planarity, and more specifically, for measuring a surface profile of a semiconductor substrate.

SUMMARY

The present disclosure provides various embodiments of improved systems and methods for determining the planarity of a semiconductor substrate. The systems and methods described herein use a metrology tool that utilizes a non-contact, laser-scanning technique to determine the planarity a semiconductor substrate. Unlike conventional techniques used to determine substrate planarity, the metrology tool disclosed herein uses a fixed optical system to measure the slope of the substrate surface at multiple points across the substrate surface as the semiconductor substrate is moved in at least one direction (e.g., an x and/or y direction). The slope measurements obtained across the substrate surface are then combined to determine a surface profile of the semiconductor substrate, or used to calculate the amount of bow or warp attributed to the substrate surface.

According to another embodiment, a metrology tool is provided herein for determining a surface profile of a substrate. The metrology tool may generally include a wafer mount configured to support the substrate, at least one movable stage coupled to move the wafer mount in at least one direction and an optical system comprising a plurality of components, which remain stationary at fixed positions while the at least one movable stage moves the wafer mount and the substrate supported thereon in the at least one direction. As the wafer mount moves in the at least one direction, the optical system: (a) directs a coherent light beam onto a surface of the substrate, (b) detects light reflected from a plurality of measurement points on the surface of the substrate, and (c) generates a plurality of output data corresponding to the detected light. The metrology tool may further include a processing device, which is coupled to receive the plurality of output data from the optical system and configured to execute program instructions stored in non-transitory memory to: (i) convert the plurality of output data into a plurality of slope data points, each corresponding to a slope of the surface of the substrate at a different measurement point on the surface of the substrate; and (ii) combine the plurality of slope data points to determine a surface profile of the substrate.

In some embodiments, the plurality of components may include a laser light source, a beamsplitter, a lens and an optical sensor. The laser light source is configured to emit the coherent light beam. The beamsplitter is coupled to receive the coherent light beam emitted by the laser light source and configured to redirect the coherent light beam onto the surface of the substrate. As the wafer mount moves in the at least one direction, the coherent light beam redirected by the beamsplitter is reflected from the surface of the substrate at each of the plurality of measurement points and transmitted back through the beamsplitter as reflected light. The lens is coupled to receive the reflected light transmitted through the beamsplitter. As the wafer mount moves in the at least one direction, the reflected light is transmitted through the lens: (a) without redirection if a slope of the surface of the substrate is zero at a given measurement point, and (b) with redirection if the slope of the surface of the substrate is not zero at the given measurement point. The optical sensor is coupled to receive the reflected light transmitted through the lens. As the wafer mount moves in the at least one direction, the optical sensor detects a position of the reflected light incident on the optical sensor and generates output data corresponding to each detected position.

In some embodiments, the output data corresponding to each detected position may correspond to: (a) a zero slope position if the slope of the surface of the substrate is zero at a given measurement point, and (b) a position displaced from the zero slope position if the slope of the surface of the substrate is not zero at the given measurement point. In such embodiments, the processing device may execute the program instructions stored in non-transitory memory to convert the output data corresponding to each detected position into a slope data point that corresponds to the slope of the surface of the substrate at each corresponding measurement point.

The at least one movable stage may generally be configured to move the wafer mount in the at least one direction to scan the coherent light beam across the surface of the substrate. In some embodiments, the substrate may be supported by the wafer mount in a horizontal orientation while the coherent light beam is scanned across the surface of the substrate. In other embodiments, the substrate may be supported by the wafer mount in a vertical orientation while the coherent light beam is scanned across the surface of the substrate.

In some embodiments, the at least one movable stage may be configured to move the wafer mount in a first direction to scan the coherent light beam across the surface of the substrate in a line, which passes through a center point on the surface of the substrate. As the coherent light beam is scanned across the surface of the substrate in the line, the optical system may: (a) detect light reflected from a first set of measurement points, which are spaced across the surface of the substrate and located along the line, and (b) generate a first set of output data corresponding to the reflected light detected from the first set of measurement points. The processing device is coupled to receive the first set of output data and configured to execute the program instructions stored in the non-transitory memory to: (i) convert the first set of output data into a first set of slope data points, each corresponding to a slope of the surface of the substrate at a different measurement point located along the line; and (ii) calculate a bow value corresponding to the substrate using the first set of slope data points.

In some embodiments, the at least one movable stage may be configured to move the wafer mount in a first direction and a second direction orthogonal to the first direction to scan the coherent light beam across the surface of the substrate in a two-dimensional (2D) array. As the coherent light beam is scanned across the surface of the substrate in the 2D array, the optical system may: (a) detect light reflected from a second set of measurement points, which are spaced across the surface of the substrate and located within the 2D array, and (b) generate a second set of output data corresponding to the reflected light detected from the second set of measurement points. The processing device may be coupled to receive the second set of output data and configured to execute the program instructions stored in the non-transitory memory to: (i) convert the second set of output data into a second set of slope data points, each corresponding to a slope of the surface of the substrate at a different measurement point within the 2D array; and (ii) calculate at least one of a bow value and a warp value corresponding to the substrate using the second set of slope data points.

According to yet another embodiment, a method is provided herein for determining a surface profile of a substrate. The method may generally include: (a) moving the substrate in at least one direction, the substrate having a substrate surface; (b) directing a coherent light beam onto the substrate surface, wherein the coherent light beam is scanned across the substrate surface as the substrate moves in the at least one direction; (c) detecting light reflected from the substrate surface, wherein the light reflected from the substrate surface is detected at a plurality of measurement points spaced across the substrate surface as the substrate moves in the at least one direction; (d) generating a plurality of output data, wherein the plurality of output data corresponds to the detected light reflected from the substrate surface at the plurality of measurement points as the substrate moves in the at least one direction; (e) converting the plurality of output data into a plurality of slope data points, wherein each slope data point corresponds to a slope of the substrate surface at a different measurement point on the substrate; and (f) determining the surface profile of the substrate using the plurality of slope data points.

In some embodiments, the method may further include supporting the substrate in a horizontal orientation, or a vertical orientation, while the coherent light beam is scanned across the substrate surface.

In some embodiments, said moving the substrate in the at least one direction may include moving the substrate in a first direction to scan the coherent light beam across the surface of the substrate in a line, which passes through a center point on the substrate surface. In such embodiments, said detecting light reflected from the substrate surface (step c) may include detecting light reflected from a first set of measurement points, which are spaced across the substrate surface and located along the line; said generating the plurality of output data (step d) may include generating a first set of output data corresponding to the reflected light detected from the first set of measurement points; said converting the plurality of output data (step e) may include converting the first set of output data into a first set of slope data points, each corresponding to a slope of the substrate surface at a different measurement point located along the line; and said determining the surface profile of the substrate (step f) may include calculating a bow value corresponding to the substrate using the first set of slope data points.

In some embodiments, said moving the substrate in the at least one direction may include moving the substrate in a first direction and a second direction orthogonal to the first direction to scan the coherent light beam across the substrate surface in a two-dimensional (2D) array. In such embodiments, said detecting light reflected from the substrate surface (step c) may include detecting light reflected from a second set of measurement points, which are spaced across the substrate surface and located within the 2D array; and generating the plurality of output data (step d) may include generating a second set of output data corresponding to the reflected light detected from the second set of measurement points; said converting the plurality of output data (step e) may include converting the second set of output data into a second set of slope data points, each corresponding to a slope of the substrate surface at a different measurement point within the 2D array; and said determining the surface profile of the substrate (step f) may include calculating at least one of a bow value and a warp value corresponding to the substrate using the second set of slope data points.

Various embodiments of metrology tools and methods are provided herein for determining a surface profile of a substrate using a non-contact, laser-scanning technique. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 7 is a flowchart diagram illustrating one embodiment of a method that utilizes the techniques described herein to determine a surface profile of a semiconductor substrate.

DETAILED DESCRIPTION

The present disclosure provides various embodiments of improved systems and methods for determining the planarity of a semiconductor substrate. The systems and methods described herein use a metrology tool that utilizes a non-contact, laser-scanning technique to determine the planarity a semiconductor substrate. Unlike conventional techniques used to determine substate planarity, the metrology tool disclosed herein uses a fixed optical system to measure the slope of the substrate surface at multiple points across the substrate surface as the semiconductor substrate is moved in at least one direction (e.g., an x and/or y direction). The slope measurements obtained across the substrate surface are then combined to determine a surface profile of the semiconductor substrate, or used to calculate the amount of bow or warp attributed to the substrate surface.

Figure 2A:
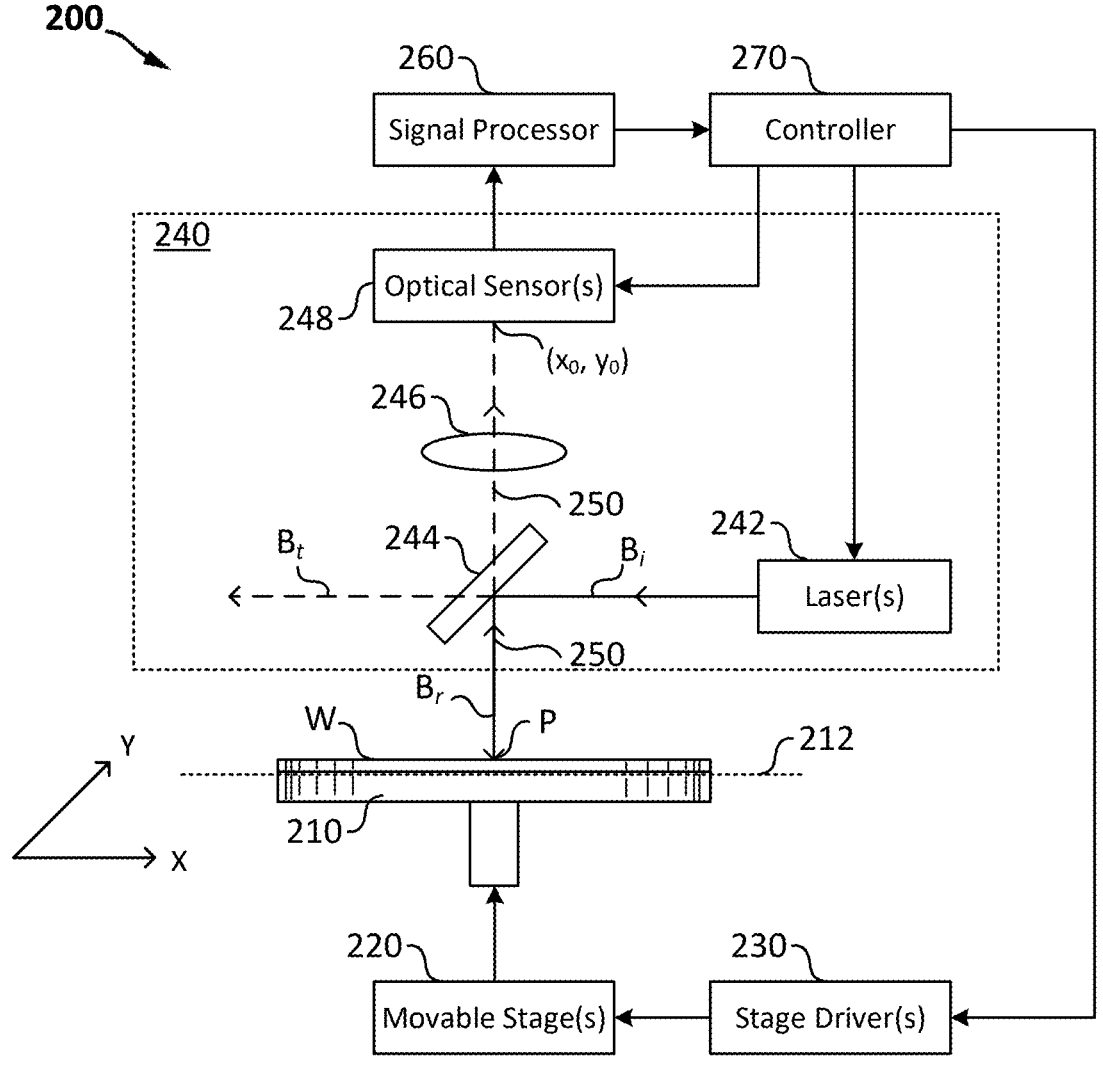
FIG. 2A is a schematic diagram illustrating one embodiment of a metrology tool that uses a non-contact, laser-scanning technique to determine a surface profile of a semiconductor substrate in accordance with the present disclosure.
Figure 2B:
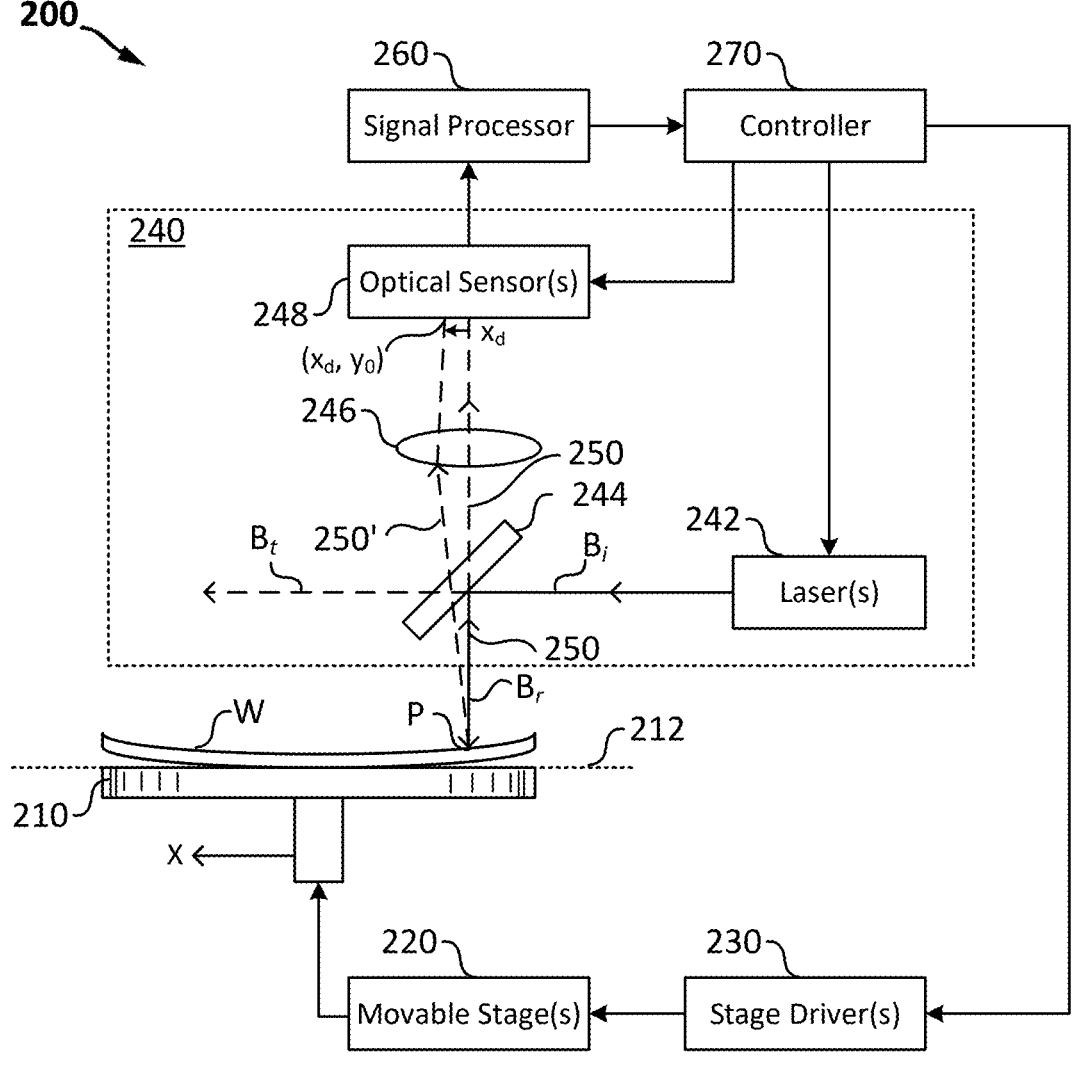
FIG. 2B is a schematic diagram of the metrology tool shown in FIG. 2A, illustrating operation of the metrology tool as a wafer mount having a bowed substrate mounted thereon moves in the x direction.

FIGS. 2A-2B illustrate an improved metrology tool for determining a surface profile of a semiconductor substrate according to one embodiment of the present disclosure. As shown in FIGS. 2A-2B, the metrology tool 200 includes a wafer mount 210 for supporting a semiconductor substrate (or wafer, W) within a support plane 212, one or more movable stages 220 for moving the wafer mount 210 in at least one direction within the support plane 212, and one or more stage drivers 230 for driving the one or more movable stages 220. In some embodiments, the movable stage(s) 220 may include a first linear stage for moving the wafer mount 210 in a first direction (e.g., the x-direction) or a second linear stage for moving the wafer mount 210 in a second direction (e.g., the y-direction), which is orthogonal to the first direction. In other embodiments, the movable stage(s) 220 may include a first linear stage and a second linear stage for moving the wafer mount 210 in the x and y directions. The metrology tool 200 further includes an optical system 240 that is configured to detect light, which is reflected from multiple points across the surface of the semiconductor substrate W as the wafer mount 210 moves in the at least one direction, and at least one processing device (such as, e.g., signal processor 260 and/or controller 270) configured to determine a surface profile of the semiconductor substrate W and/or calculate the amount of bow or warp attributed to the substrate surface based on the light detected by the optical system 240.

The optical system 240 includes a plurality of components, which remain stationary at fixed positions while the movable stage(s) 220 move the wafer mount 210 and the semiconductor substrate W supported thereon in the at least one direction (e.g., the x and/or y direction). As the wafer mount 210 moves in the at least one direction, the optical system 240: (a) directs a coherent light beam onto a surface of the substrate, (b) detects light reflected from a plurality of measurement points (P$_i$) on the surface of the substrate, and (c) generates a plurality of output data corresponding to the detected light.

The optical system 240 may generally include a wide variety, number and arrangement of light sources, optically transmissive and reflective components, and optical sensors. In the embodiment shown in FIGS. 2A-2B, the optical system 240 includes at least one laser light source 242, beamsplitter 244, lens 246 and optical sensor 248, all of which are fixed in position and not movable. In some embodiments, the optical system 240 may include a plurality of laser light sources 242, a plurality of beamsplitters 244, a plurality of lenses 246 and a plurality of optical sensors 248 to improve throughput.

The laser light source 242 is arranged within the optical system 240 so as to emit a coherent light beam (B$_i$), which is directed toward and incident on the beamsplitter 244. A wide variety of laser light sources may be used within the optical system 240 including, for example, gas lasers, solid state lasers, fiber lasers, liquid lasers and semiconductor lasers. The diameter of the coherent light beam (e.g., the laser diameter or spot size) may range, for example, between 0.1 mm and 10 mm.

The beamsplitter 244 splits the incident light beam (B$_i$) into two distinct portions: (a) a transmitted light beam (B$_t$) that passes through the beamsplitter 244, and (b) a reflected light beam (B$_r$) that is redirected onto a surface of the semiconductor substrate W. The percentage of light redirected onto the substrate surface depends on a variety of factors, such as the refractive index of the material used to form the beamsplitter 244, the angle of incidence (AOI) of the incident light beam (B$_i$) on the beamsplitter 244, and the quality of the beamsplitter's surfaces. For example, a beamsplitter designed to redirect light at a 45° AOI and having a high-quality surface finish may redirect approximately 50-90% of the incident light beam (B$_i$) onto the substrate surface.

A wide variety of beamsplitters can be used to redirect a portion of the incident light beam (B$_i$) onto the substrate surface. In the embodiment shown in FIGS. 2A-2B, the beamsplitter 244 is depicted as a plate beamsplitter comprising a thin, flat glass plate having a partially transmissive coating (e.g., a thin metallic coating) on the incident beam side. In some embodiments, an anti-reflective coating may be applied to the opposite side of the glass plate to remove unwanted Fresnel reflections. While plate beamsplitters are light weight and relatively inexpensive, a small beam shift (not shown in FIG. 2A) occurs when light is transmitted through the glass plate. This beam shift is generally dependent on the thickness of the glass plate, the refractive index of the material used to form the glass plate and the angle of incidence (AOI) of the incident light beam (B$_i$) on the glass plate. Although the beam shift is typically small, other beamsplitters can be used to avoid shifting the beam of transmitted light. For example, a cube beamsplitter may be used in place of the plate beamsplitter shown in FIGS. 2A-2B. A cube beamsplitter is typically constructed of two right angle prisms. In a cube beamsplitter, the hypotenuse surface is coated with a partially transmissive coating and the two prisms are bonded together. While cube beamsplitters are heavier and typically more expensive than plate beamsplitters, they have the advantage of providing equal reflected and transmitted optical path lengths by avoiding the beam shift of transmitted light.

As shown in FIGS. 2A-2B, beamsplitter 244 redirects a portion (e.g., 50-90%) of the incident coherent light beam (B$_i$) in a direction perpendicular to the support plane 212 onto a measurement point (P) on the surface of the semiconductor substrate W. The portion of the incident coherent light beam (i.e., the reflected light beam, B$_r$) redirected by the beamsplitter 244 is reflected from the substrate surface at the measurement point (P) and transmitted back through the beamsplitter 244 as reflected light 250, which passes through the lens 246 to impinge upon a photosensitive surface of the optical sensor 248.

The lens 246 is a convergent lens whose principle axis is optically aligned with the beamsplitter 244 and the photosensitive surface of the optical sensor 248. The lens 246 is positioned a focal length away from the optical sensor 248, so that the focal point of the lens 246 falls on the photosensitive surface of the optical sensor 248. A wide variety of converging lenses may be used to focus the reflected light 250 onto the photosensitive surface of the optical sensor 248. For example, the lens 246 may be a double convex lens, as depicted in FIGS. 2A-2B. However, one skilled in the art would understand how other convergent lens configurations may alternatively be used to focus the reflected light 250 onto the photosensitive surface of the optical sensor 248.

Optical sensor 248 includes a plurality of photosensitive elements. For example, the optical sensor 248 may include a plurality of photoresistors, photodiodes or phototransistors arranged in a one-dimensional (1D) or two-dimensional (2D) array. In some embodiments, the optical sensor 248 may be a 2D image sensor or camera, such as but not limited to, a charged coupled device (CCD) or complementary metal oxide semiconductor (CMOS) image sensor/camera. In some embodiments, the optical sensor 248 may be a position-sensitive detector (PSD), which is specifically designed to measure the position of a light spot in one or two dimensions on the photosensitive surface. Other optical sensor configurations may be used, as is known in the art.

The optical sensor 248 shown in FIGS. 2A-2B receives the reflected light 250 transmitted through the lens 246, detects a position (x, y) of the reflected light 250 incident on the photosensitive surface of the optical sensor 248 and generates output data corresponding to the detected position. In some embodiments, the signal processor 260 may receive the output data generated by the optical sensor 248 and execute program instructions stored within non-transitory memory to determine a slope of the substrate surface at a given measurement point (P) based on the detected position (x, y) of the reflected light 250 incident on the photosensitive surface of the optical sensor 248. In other embodiments, the signal processor 260 may be omitted and the controller 270 may perform the signal processing functions needed to convert the detected position (x, y) of the reflected light 250 incident on the photosensitive surface of the optical sensor 248 into a slope measurement at the given measurement point (P).

The optical system 240 and the wafer mount 210 are preferably movable in relation to one another. Such relative movement may be rotational, horizontal and/or vertical. As would be appreciated by one skilled in the art, relative movement between the optical system 240 and the wafer mount 210 may be implemented by moving the wafer mount 210, moving the optical system 240, or moving both the wafer mount 210 and the optical system 240. In preferred embodiments, the optical system 240 components remain stationary in fixed positions while the wafer mount 210 moves in at least one direction (e.g., the x and/or y direction) to scan the coherent light beam redirected by the beamsplitter 244 across the surface of the substrate. This avoids introducing motion artifacts into the output data collected from the substrate surface. Examples of how the wafer mount 210 can be moved in relation to the optical system 240 to scan the coherent light beam redirected by the beamsplitter 244 across the surface of the substrate are shown in FIGS. 2A-2B, FIGS. 4A-4B and described in more detail below.

In some embodiments, the wafer mount 210 may be configured to support the semiconductor substrate W in a horizontal orientation, while the coherent light beam is scanned across the surface of the substrate, as shown in FIGS. 2A-2B. In other embodiments (not shown), a vertical wafer mount may be used to support the semiconductor substrate W in a vertical orientation, while the coherent light beam is scanned across the substrate surface. A wide variety of wafer mounts can be used to support the semiconductor substrate W in a horizontal or vertical orientation, including zero gravity air flow mounts, zero gravity viscous fluid mounts, flat mounts, edge support mounts and other wafer mounts known in the art.

As the wafer mount 210 moves in the at least one direction (e.g., the x and/or y direction), the portion of the incident coherent light beam (i.e., the reflected light beam, $B_r$) redirected by the beamsplitter 244 in the direction perpendicular to the support plane 212 is scanned across the surface of the semiconductor substrate W, reflected from the substrate surface at a plurality of measurement points ($P_i$) and transmitted back through the beamsplitter 244 as reflected light 250. As shown in FIGS. 2A-2B and FIGS. 3A-3B, the angle at which the reflected light 250 is reflected from the substrate surface (i.e., the angle of reflection, $\alpha_r$) depends, at least in part, on the local slope of the substrate surface at each measurement point ($P_i$). The local slope may be: (a) zero if the substrate surface is flat and parallel to the support plane 212 at a given measurement point, (b) a positive value if the substrate surface is sloped upwards away from the support plane 212, or (c) a negative value if the substrate surface is sloped down towards the support plane 212.

Figure 3A:
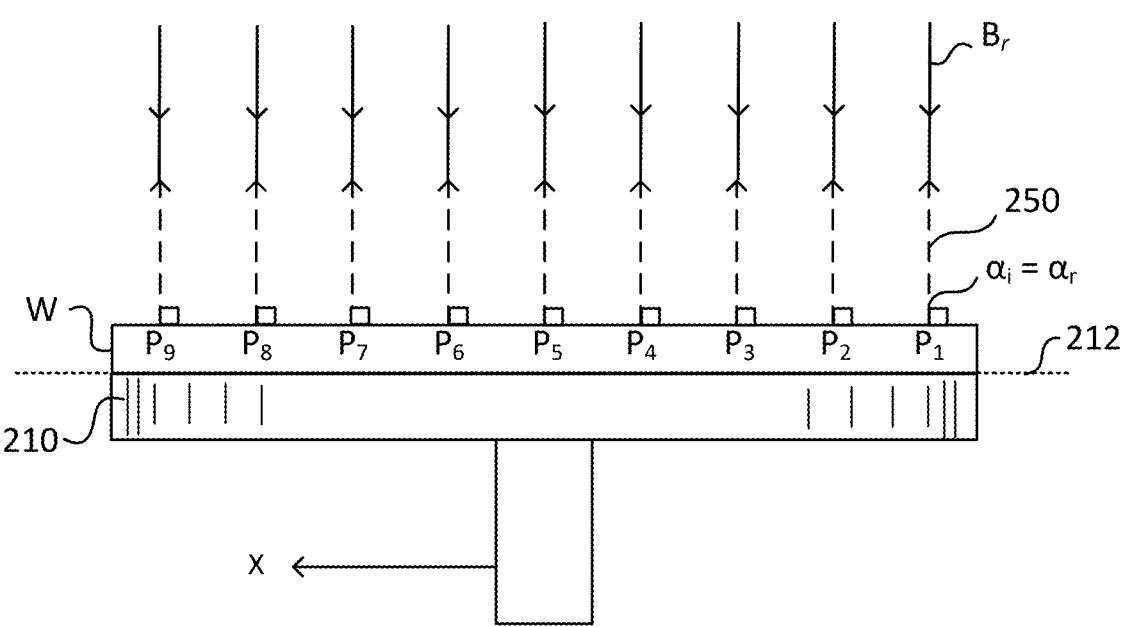
FIG. 3A is a side-view of a wafer mount having a planar substrate mounted thereon, illustrating a coherent light beam directed onto, and reflected from, the surface of the planar substrate at a plurality of measurement points ($P_i$).

In the embodiment shown in FIGS. 2A and 3A, a semiconductor substrate W having a substantially planar surface is provided on the wafer mount 210, while the coherent light beam is scanned across the substrate surface to obtain slope measurements from a plurality of measurement points (e.g., $P_1$-$P_9$) spaced across the substrate surface. When a semiconductor substrate W with a substantially planar surface is provided on the wafer mount 210, as shown in FIGS. 2A and 3A, the angle of incidence ($\alpha_i$) of the reflected light beam ($B_r$) on the substrate surface and the angle of reflection ($\alpha_r$) of the reflected light 250 reflected from the substrate surface may be substantially equal to 0° (relative to the surface normal) at each (or at least a majority) of the measurement points ($P_i$).

As shown in FIG. 2A, the light 250 reflected from a substantially planar surface at a given measurement point ($P_i$) is transmitted through the beamsplitter 244 and passed through the principle axis of the lens 246 without redirection. This allows the reflected light 250 to contact the photosensitive elements of the optical sensor 248 at a position (x, y) corresponding to a predetermined zero slope position ($x_0$, $y_0$). As the wafer mount 210 moves in the at least one direction (e.g., the x direction shown in FIGS. 2A and 3A) to scan the reflected light beam ($B_r$) across the substrate surface, the optical sensor 248 detects the position (x, y) of the reflected light 250 that is reflected from each measurement point ($P_i$), transmitted through the beamsplitter 244 and passed through the lens 246 to the optical sensor 248. If the substrate surface is substantially planar (or flat), as shown in FIGS. 2A and 3A, the position (x, y) of the reflected light 250 incident on the optical sensor 248 may correspond to the zero slope position ($x_0$, $y_0$) for at least a majority of the measurement points ($P_i$).

Figure 3B:
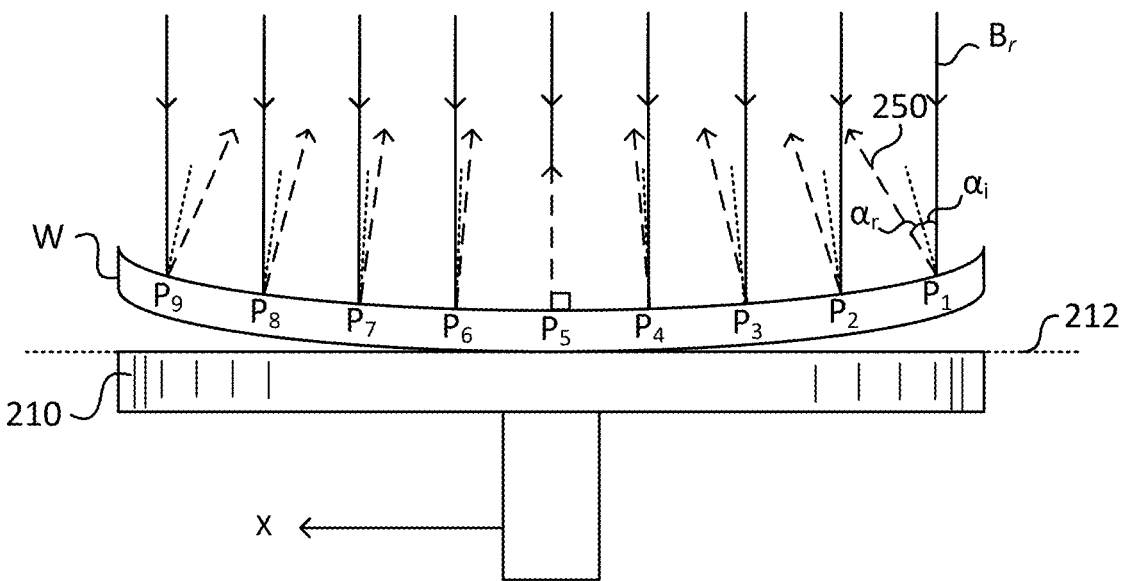
FIG. 3B is a side-view of a wafer mount having a bowed substrate mounted thereon, illustrating a coherent light beam directed onto, and reflected from, the surface of the bowed substrate at a plurality of measurement points ($P_i$).

Although a substantially planar substrate is shown in FIGS. 2A and 3A, other substrates provided on the wafer mount 210 may have a substantially non-planar surface (e.g., a bowed or warped surface). FIGS. 2B and 3B illustrate an embodiment in which a semiconductor substrate W having a non-planar surface is provided on the wafer mount 210, while the coherent light beam is scanned across the substrate surface to obtain slope measurements from a plurality of measurement points (e.g., $P_1$-$P_9$) spaced across the substrate surface. As shown in FIGS. 2B and 3B, the angle of incidence ($\alpha_i$) and the angle of reflection ($\alpha_r$) may be significantly greater than 0° at one or more measurements when a semiconductor substrate W having a bowed or warped surface is provided on the wafer mount 210.

As shown in FIGS. 2B and 3B, the angle of reflection ($\alpha_r$) increases with increasing slope, while the direction of slope (i.e., positive or negative) determines the direction at which light is reflected from the substrate surface at the measurement point ($P_i$). For measurement points having a positive slope (e.g., measurement points $P_1$-$P_4$ in FIG. 3B), the reflected light 250' transmitted through the beamsplitter 244 passes through the lens 246 to left of the principle axis, causing the lens 246 to redirect the reflected light 250' onto the photosensitive surface of the optical sensor 248, as shown in FIG. 2B. For measurement points having a negative slope (e.g., measurement points $P_6$-$P_9$ in FIG. 3B), the reflected light 250' transmitted through the beamsplitter 244 passes through the lens 246 to the right of the principle axis, again causing the lens 246 to redirect the reflected light 250' onto the photosensitive surface of the optical sensor 248. By redirecting the light reflected from sloped surfaces, the lens 246 ensures that the reflected light reaches the photosensitive surface of the optical sensor 248, regardless of the degree or direction of slope, thus preventing the need for an optical sensor with a larger photosensitive surface.

As shown in FIG. 2B, the light 250' reflected from a non-planar surface at a given measurement point ($P_i$) is transmitted through the beamsplitter 244 and passed through the principle axis of the lens 246 with redirection. This allows the reflected light 250' to contact the photosensitive elements of the optical sensor 248 at a position (x, y) displaced from the zero slope position ($x_0$, $y_0$). The position of the reflected light 250' incident on the optical sensor 248 may be displaced from the zero slope position ($x_0$, $y_0$): (a) in the x-direction by an amount ($x_d$, $y_0$), (b) in the y-direction by an amount ($x_0$, $y_d$), or (c) in both the x and y directions by an amount ($x_d$, $y_d$). As the wafer mount 210 moves in the at least one direction (e.g., the x direction shown in FIGS. 2A and 3A) to scan the reflected light beam ($B_r$) across the substrate surface, the optical sensor 248 detects the position (x, y) of the light that is reflected from each measurement point ($P_i$), transmitted through the beamsplitter 244 and passed through the lens 246 to the optical sensor 248. For substrates having non-planar surfaces (e.g., bowed or warped surfaces), as shown in FIGS. 2B and 3B, the position (x, y) of the reflected light 250' incident on the optical sensor 248 may deviate from the zero slope position ($x_0$, $y_0$) for many of the measurement points ($P_i$).

As noted above, the signal processor 260 (or the controller 270) may receive the output data generated by the optical sensor 248 and execute program instructions stored within non-transitory memory to determine a slope of the substrate surface at each of the measurement points ($P_i$) based on the detected position (x, y) of the reflected light 250 or 250' incident on the photosensitive surface of the optical sensor 248. The signal processor 260 (or the controller 270) may combine the slope measurements obtained from the substrate surface to determine a surface profile of the semiconductor substrate, or use the slope measurements to calculate the amount of bow or warp attributed to the substrate surface.

Figure 4A:
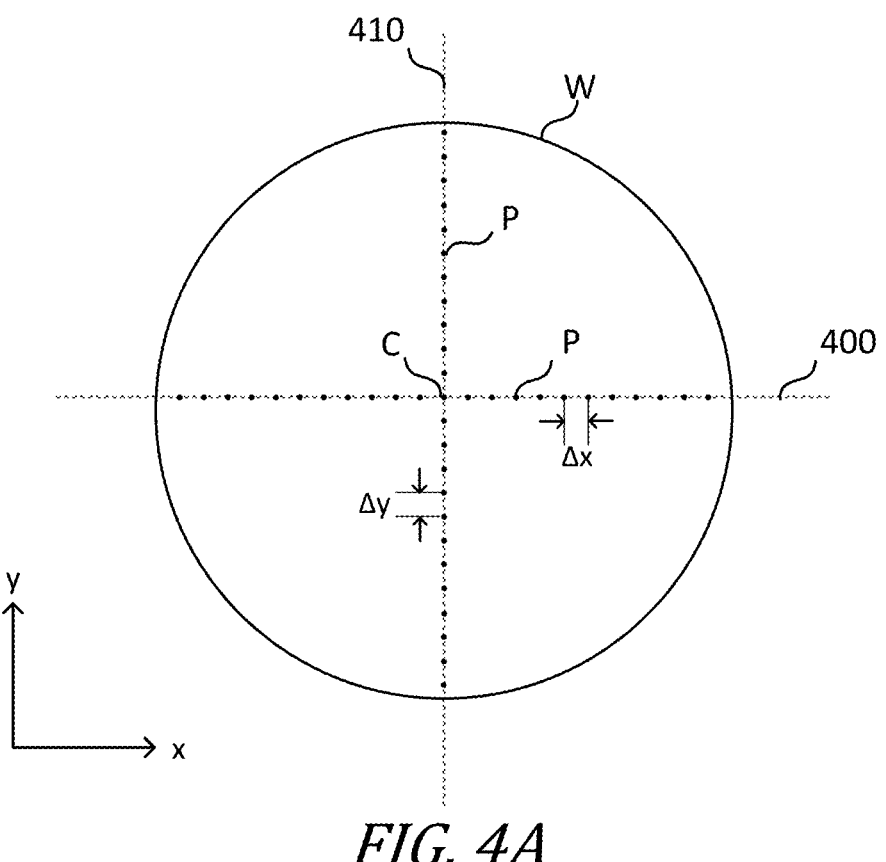
FIG. 4A is a top down view of a semiconductor substrate, illustrating example line scan methods used by the metrology tool shown in FIGS. 2A-2B to obtain a plurality of slope measurements, which are spaced across the substrate surface along a line passing through a center point (C) on the substrate surface.

FIG. 4A depicts example line scan methods that may be used by the metrology tool 200 shown in FIGS. 2A-2B to obtain a plurality of slope measurements from the substrate surface. In the embodiment shown in FIG. 4A, the wafer mount 210 is moved in a first direction (e.g., the x-direction or the y-direction) to scan the coherent light beam across the substrate surface in a line (e.g., a line 400 or a line 410), which passes through a center point (C) on the substrate surface. As the coherent light beam is scanned across the surface of the substrate in the line, the optical system 240: (a) detects light reflected from a first set of measurement points (P), which are spaced across the surface of the substrate and located along the line, and (b) generates a first set of output data corresponding to the reflected light detected from the first set of measurement points. The first set of output data corresponds to the position (x, y) of the reflected light 250 or 250' that is detected by the optical sensor 248 for each of the first set of measurement points (P). As noted above, the detected position (x, y) may correspond to: (a) a zero slope position $(x_0, y_0)$ if the slope of the surface of the substrate is zero at a given measurement point $(P_i)$, or (b) a position displaced from the zero slope position $(x_0, y_0)$ if the slope of the surface of the substrate is not zero at the given measurement point $(P_i)$.

The signal processor 260 (or the controller 270) receives the first set of output data generated by the optical sensor 248 in response to the line scan, and executes program instructions stored within non-transitory memory to convert the first set of output data into a first set of slope data points, each corresponding to a slope of the substrate surface at a different measurement point $(P_i)$ located along the line. In some embodiments, the signal processor 260 (or the controller 270) may calculate a bow value corresponding to the substrate using the first set of slope data points. One example of a bow value calculation is discussed in more detail below.

Figure 4B:
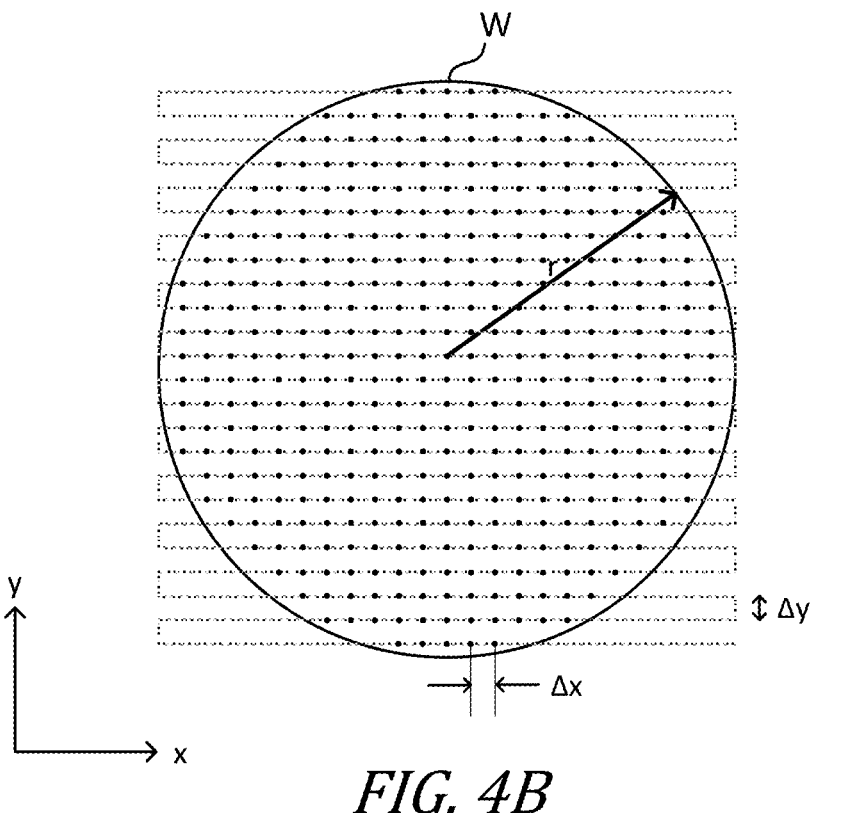
FIG. 4B is a top down view of a semiconductor substrate, illustrating an example two-dimensional (2D) array scan method used by the metrology tool shown in FIGS. 2A-2B to obtain a plurality of slope measurements, which are spaced across the substrate surface and located within the 2D array.

FIG. 4B depicts an example 2D array scan method that may be used by the metrology tool 200 shown in FIGS. 2A-2B to obtain a plurality of slope measurements from the substrate surface. In the embodiment shown in FIG. 4B, the wafer mount 210 is moved in a first direction (e.g., the x-direction) and a second direction (e.g., the y-direction) orthogonal to the first direction to scan the coherent light beam across the surface of the substrate in a 2D array. As the coherent light beam is scanned across the surface of the substrate in the 2D array, the optical system 240: (a) detects light reflected from a second set of measurement points (P), which are spaced across the surface of the substrate and located within the 2D array, and (b) generates a second set of output data corresponding to the reflected light detected from the second set of measurement points. The second set of output data corresponds to the position (x,y) of the reflected light 250 or 250' that is detected by the optical sensor 248 for each of the second set of measurement points (P). As noted above, the detected position (x,y) may correspond to: (a) a zero slope position $(x_0, y_0)$ if the slope of the surface of the substrate is zero at a given measurement point (P), or (b) a position displaced from the zero slope position $(x_0, y_0)$ if the slope of the surface of the substrate is not zero at the given measurement point $(P_i)$.

The signal processor 260 (or the controller 270) receives the first set of output data generated by the optical sensor 248 in response to the 2D array scan, and executes program instructions stored within non-transitory memory to convert the second set of output data into a second set of slope data points, each corresponding to a slope of the surface of the substrate at a different measurement point $(P_i)$ within the 2D array. In some embodiments, the signal processor 260 (or the controller 270) may calculate a bow value and a warp value corresponding to the substrate using the second set of slope data points. In other embodiments, the signal processor 260 (or the controller 270) may combine the second set of slope data points to generate a surface profile map or function of the semiconductor substrate.

The method used to determine the surface profile of the semiconductor substrate may generally depend on the amount of slope data collected from the substrate surface. In some embodiments, the line scan method shown in FIG. 4A may be used to obtain slope measurements from the substrate surface every 1-5 mm while scanning the coherent light beam across the diameter of the substrate. Depending on the measurement frequency ($\Delta x$ or $\Delta y$), this method may result in approximately 60 to 300 slope measurements for a 300 mm substrate, which may be sufficient to characterize the substrate bow.

In other embodiments, the 2D array scan shown in FIG. 4B may be used to obtain slope measurements from the substrate surface every 1-5 mm while scanning the coherent light beam across the entire substrate surface in both the x and y directions. Depending on the measurement frequency (e.g., $\Delta x$ may be 1-5 mm) and range of step (e.g., $\Delta y$ may be 1-50 mm), this method may result in approximately 5,000 to 10,000 slope measurements for a 300 mm substrate, which may be sufficient to map the surface profile of the semiconductor substrate and calculate the amount of bow and warp attributed to the substrate.

By scanning the wafer and taking numerous slope measurements across the substrate surface, any faulty sites caused by scribe lines or areas of varying metal density within the die, such as IO circuits, bonding pads, memory and logic areas, will be smoothed out by averaging the slope data. In some embodiments, the diameter of the coherent light beam (e.g., the laser diameter or the spot size) may be varied. Increasing the laser diameter from 3 mm to 10 mm will result in more averaging, reducing the number of data points collected and increasing throughput speed. Conversely, using a very small laser spot size of 0.1 mm to 1 mm will magnify the effects of metal density, leading to more variability in the collected data.

A wide variety of methods may be used to determine the surface profile of a semiconductor substrate using the slope measurements obtained from the substrate surface. In one example method, the curve of the substrate surface can be calculated from the slope of many points on the substrate surface using a technique called "stitching." Stitching involves taking multiple slope measurements from the substrate surface and then combining the slope data to create a surface profile map, or function, of the entire substrate surface. The function is the surface map, which is a 2D representation of the slope data. In some embodiments, the integral of the function can be used to determine the bow of the substrate surface. In other embodiments, derivative of the function can be used to determine the curvature of the wafer at each location across the surface.

Figure 5:
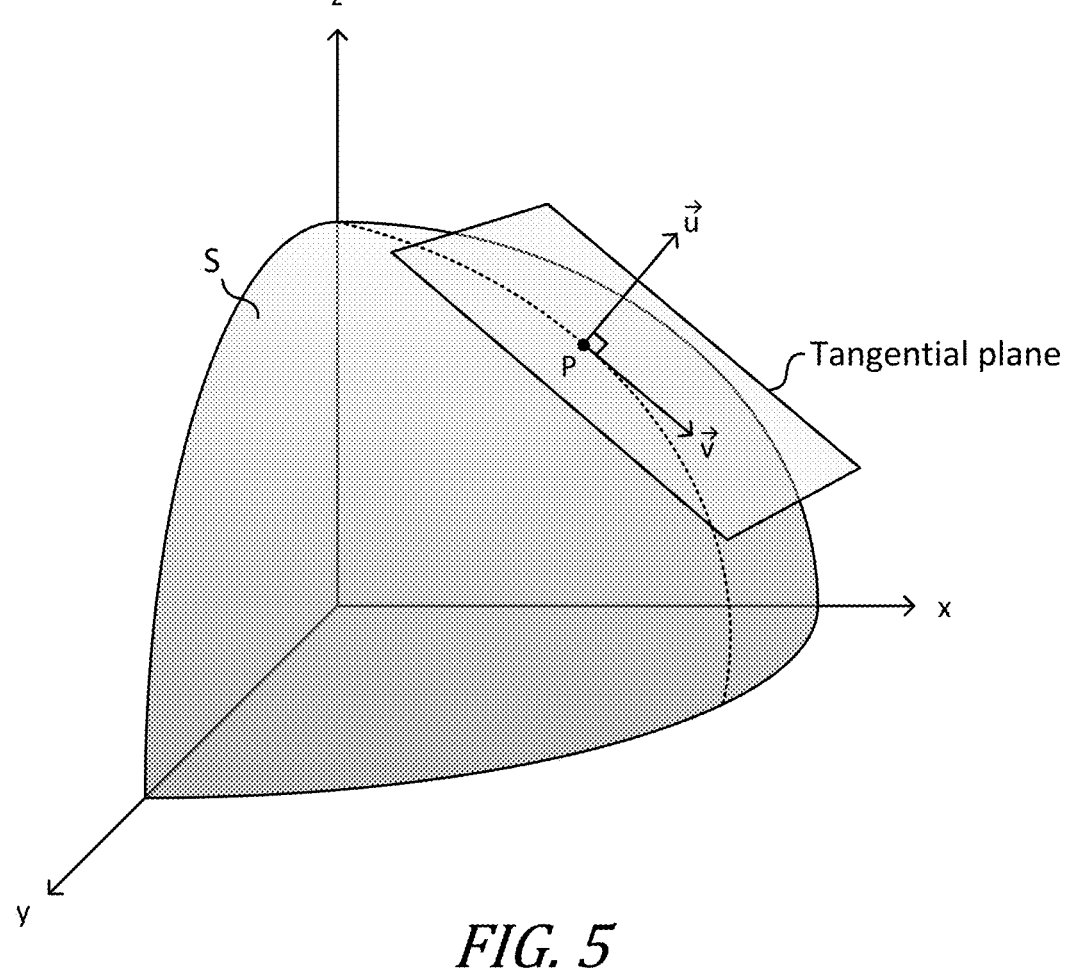
FIG. 5 is a graph illustrating a point (P) on a curved surface, a unit vector (v) tangential to the curved surface and a unit vector (u) normal to the curved surface at the point (P).

In some embodiments, the second fundamental form of differential geometry can be used to calculate a Gaussian curvature of a surface given many points of slope data. The second fundamental form relates to the curvature of a surface in three-dimensional space, and it can be calculated using the following formula:

$$K=(\det(-dN/ds))/(\det(g)) \qquad \text{EQ. 1}$$

where K is the Gaussian curvature, dN/ds is the rate of change of the surface normal, and g is the metric tensor of the surface. The rate of change of the surface normal (dN/ds) can be calculated using the slope of the surface at different points, as follows:

$$dN/ds=-[\nabla f \times \nabla g]/\|\nabla f \times \nabla g\|^2 \qquad \text{EQ. 2}$$

where $\nabla f$ and $\nabla g$ are the gradient vectors of the surface in the u and v directions, respectively, and x represents the cross product. FIG. 5 illustrates a point (P) on a curved surface(S), a unit vector (v) tangential to the curved surface and a unit vector (u) normal to the curved surface at the point (P). After calculating the rate of change of the surface normal (dN/ds) according to EQ. 2, it can be substituted into the formula shown in EQ. 1 for the second fundamental form to obtain the Gaussian curvature. The Gaussian curvature is a measure of the intrinsic curvature of the surface, and it can be used to classify the surface as either positively curved (like a sphere), negatively curved (like a saddle), or flat (like a plane).

In some embodiments, the substrate bow may be calculated by fitting a polynomial or spline curve to the slope data points obtained from the substrate surface. One common approach is to fit a third-order polynomial curve to the slope data, which can be expressed as:

$$z=a_0+a_1x+a_2y+a_3x^2+a_4xy+a_5y^2+a_6x^3+a_7x^2y+a_8xy^2+a_9y^3 \qquad \text{EQ. 3}$$

where z is the height of the substrate surface, x and y are the position coordinates on the substrate, and $a_0$ to $a_9$ are coefficients that are determined by fitting the polynomial curve to the slope data.

After determining the coefficients of the polynomial curve ($a_0$ to $a_9$) according to EQ. 3, they can be used to calculate the bow of the wafer by evaluating the curvature of the polynomial curve at its center point. The curvature can be calculated using the formula shown in EQ. 4:

$$K=2(a_3a_5)-a_4^2 \qquad \text{EQ. 4}$$

where K is the curvature of the polynomial curve. The bow of the substrate (or bow value) can then be calculated as the difference between the height of the substrate at the center point (z (center)) and the average height of the substrate at its outer edges, using the formula shown in EQ. 5:

$$\text{Bow}=[z(\text{center})-(z(\text{outer\_}pt1)+z(\text{outer\_}pt2)+ \dots +z(\text{outer\_}ptn))/n]*100\% \qquad \text{EQ. 5}$$

where n is the number of points around the edge of the substrate that are used to calculate the average height.

The warp of a substrate can be calculated from the slope of many points on the substrate's surface using a similar approach to the one used for calculating the bow. Warp is a measure of the non-flatness of the wafer, and can be calculated by fitting a polynomial or spline curve to the slope data, just like for the bow. However, the curvature of the curve is calculated at multiple points, rather than just the center point, to obtain a more complete picture of the substrate's surface profile.

One common approach for determining the warp of a substrate is to fit a third-order polynomial curve to the slope data, as described above. After determining the coefficients of the polynomial curve ($a_0$ to $a_9$) according to EQ. 3, the curvature of the curve is calculated at multiple points around the periphery of the substrate, using the formula shown in EQ. 4. The warp of the substrate (or warp value) can then be calculated as the maximum deviation of the height of the substrate from the fitted curve, using the formula shown in EQ. 6:

$$\text{Warp}=\max|z-z\_fit| \qquad \text{EQ. 6}$$

where z is the height of the substrate at a given point, and z_fit is the height of the fitted curve at the same point. In practice, the warp calculation is often done using software that can automatically process the slope data and perform the necessary curve fitting and curvature calculations. The resulting warp value can be used to determine the quality and suitability of the wafer for various applications, such as semiconductor manufacturing.

In some embodiments, the signal processor 260 (or the controller 270) may execute program instructions stored in non-transitory memory to create a surface profile map, or function, of the entire substrate surface, calculate a bow value or calculate a warp value using one or more of the methods described above. In some embodiments, the controller 270 may perform additional and/or alternative functions, such as controlling operation of the moveable stage(s) 220 via the stage driver(s) 230 or controlling operation of the laser light source(s) 242 or optical sensor(s) 248. The controller 270 may perform other functions, as is known in the art.

The signal processor 260 and the controller 270 may each be implemented in a wide variety of ways. In one example, the signal processor 260 and/or the controller 270 may be a computer. In another example, the signal processor 260 and/or the controller 270 may include one or more programmable integrated circuits that are programmed to provide the functionality described herein. For example, one or more processors (e.g., a microprocessor, microcontroller, central processing unit, etc.), programmable logic devices (e.g., a complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits can cause the programmable integrated circuits to perform the processes, functions, and/or capabilities described herein. Other variations could also be implemented.

Figure 6:
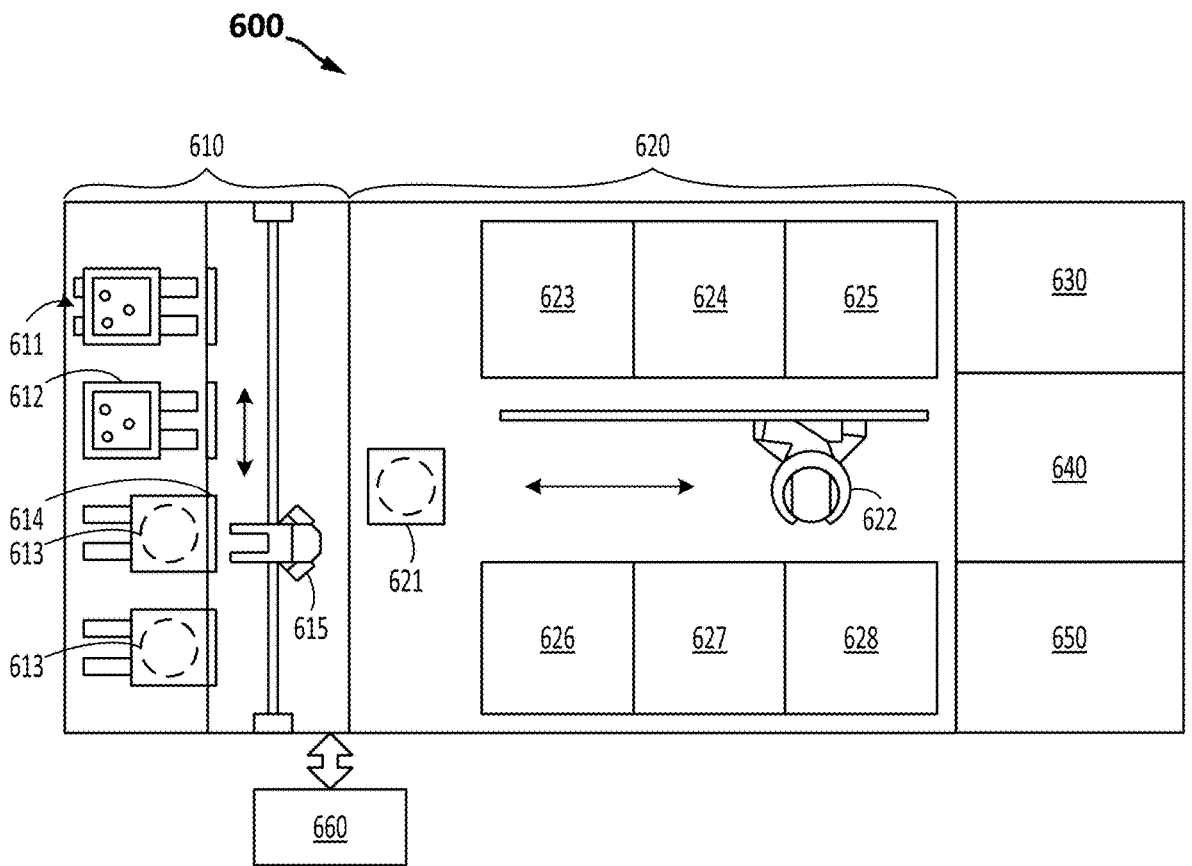
FIG. 6 is a plan view of an exemplary substrate processing system comprising a metrology module for determining a surface profile of a semiconductor substrate.

The metrology tool 200 shown in FIGS. 2A-2B may be a stand-alone or may be incorporated within a wafer processing system. FIG. 6 is a plan view of an exemplary wafer processing system 600 (e.g., a track lithography tool) in which the metrology tool 200 can be incorporated to determine the surface profile of at least one substrate processed by the system.

The wafer processing system 600 shown in FIG. 6 includes various wafer handling components or carriers, along with several stages such as, for example, a carrier stage 610, a treatment stage 620. The wafer processing system 600 can also include other wafer processing components, such as for example, a stepper/scanner 630, a singulation device 640 and a bonding tool 650.

Figure 1A:
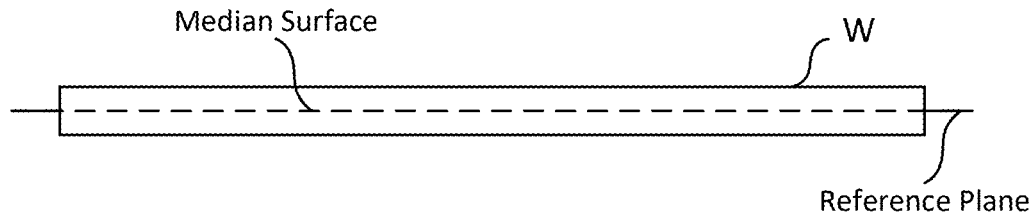
FIGS. 1A-1C are schematic diagrams illustrating: (A) a flat semiconductor substrate, (B) bowing of a semiconductor substrate and (C) warping of a semiconductor substrate.
Figure 1B:
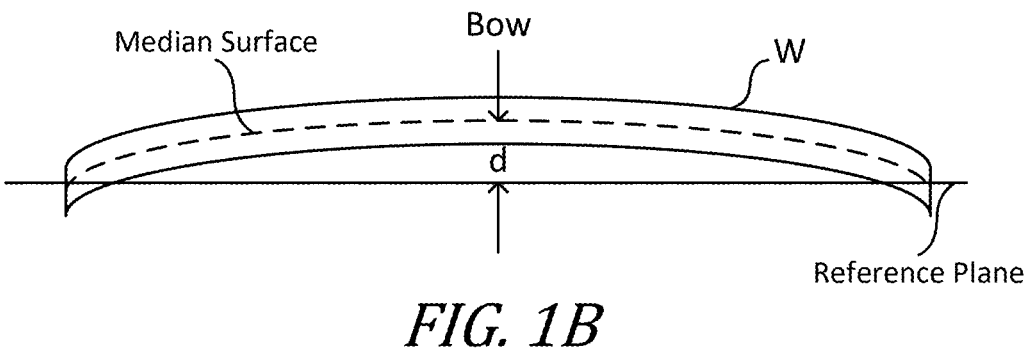
Figure 1C:
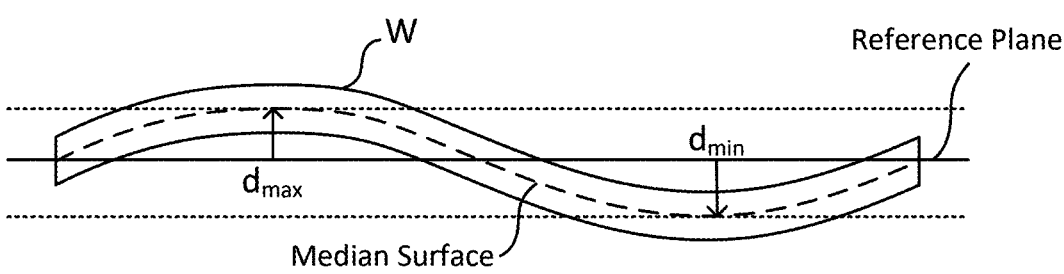

The carrier stage 610 includes one or more pod assemblies 611 configured to receive one or more wafer cassettes 612. The wafer cassettes are configured to contain one or more substrates 613 to be processed by the wafer processing system 600. The substrates to be processed may be substantially flat as shown in FIG. 1A, bowed as shown in FIG. 1B or warped as shown in FIG. 1C. Doors 614 are provided within the pod assemblies 611 to access the substrates 613 contained in the wafer cassettes 612. A carrier transfer robot 615 can move up and down within the carrier stage 610 to transfer the substrates 613 from the wafer cassettes 612 to a shelf unit 621, which is provided in the treatment stage 620 for temporarily storing the substrates 613.

The treatment stage 620 includes a plurality of modules 623-628 and a treatment transfer robot 622. The treatment transfer robot 622 is configured to access the shelf unit 621 and the modules 623-628 for transferring the substrates 613 among the modules 623-628 for various processing. In some embodiments, the treatment transfer robot 622 can also flip and rotate the substrates 613 before inserting the wafers into the various modules 623-628. The modules 623-628 can include a wide variety of treatment modules and metrology modules, as discussed further herein.

For example, the modules 623-628 included within the treatment stage 620 may include at least one metrology module 623, which is configured to determine a surface profile of the substrates 613 or measure an amount of bow or warp attributed to the substrates 613 and provide such measurements to the wafer processing system 600. The substrates 613, which have a working surface and a backside surface opposite to the working surface, may have an initial bow or warp resulting from one or more microfabrication processing steps that have been executed to create at least part of a semiconductor device on the working surface of the substrate 613. By characterizing the initial bow or warp and providing an initial bow or warp value to the wafer processing system 600, the wafer processing system 600 may perform one or more processing steps to correct or mitigate the wafer bow or warpage.

The metrology module 623 detects and characterizes the surface profile of a substrate 613 based on slope measurements obtained from the substrate surface. For example, the metrology module 623 may include the metrology tool shown and described in reference to FIGS. 2A-2B. Upon receiving a substrate 613 from the treatment transfer robot 622, the metrology module 623 (or metrology tool 200) scans a coherent light beam across the substrate surface as the substrate 613 moves in at least one direction, detects light reflected from the substrate surface at a plurality of measurement points spaced across the substrate surface, and obtains slope data corresponding to a slope of the substrate surface at each of the measurement points. As noted above, the slope data may be used to create a surface profile map, or function, of the entire substrate surface, or calculate a bow or warp value corresponding to the substrate surface.

The bow measurement provided by the metrology module 623 (or metrology tool 200) can include a degree of convexity or concavity, or a mapping of z-height deviation values on a wafer relative to one or more reference z-height deviation values. The reference z-height deviation values may be close to zero, and thus, representative of a wafer that is substantially flat. As used herein, a substrate that is substantially flat (or considered flat for overlay improvement purposes) can be a substrate having an average z-height deviation value of less than, for example, 10 microns. The z-height deviation values calculated by the metrology module 623 can be spatially mapped (e.g., with (x, y) coordinate locations) to identify z-height deviation values across the substrate surface. The initial bow measurement provided by the metrology module 623 can include raw bow data, or be represented as a bow signature with relative z-height deviation values. The raw bow data and/or the z-height deviation values can be mapped at various resolutions, depending on types of metrology equipment used and/or a resolution desired.

In some embodiments, the wafer processing system 600 may use an initial bow measurement provided by the metrology module 623 (or metrology tool 200) to correct or mitigate the substrate bow by performing one or more processing steps on the bowed substrate 613. For example, the treatment transfer robot 622 may transfer the bowed substrate 613 to one or more treatment modules for bow mitigation. Examples of treatment modules that may be used to correct substrate bow include film formation modules, bake modules, etc.

In some embodiments, the modules 623-628 included within the treatment stage 620 can include one or more film formation modules 624 configured to form one or more films (such as, e.g., a shape control film) on a surface of the substrate 613 being processed. The film formation module 624 can be configured to deposit a shape control film on the frontside and/or backside surface of the substrate 613 using chemical vapor deposition (CVD), atomic layer deposition (ALD), a spin-on film deposition process, or another deposition technique. The film formation module 624 and the metrology module 623 can be installed on a common platform having an automated wafer handling system that automatically moves the substrate 613 from the metrology module 623 to the film formation module 624.

In some embodiments, the modules 623-628 included within the treatment stage 620 can also include one or more bake modules 625 that are configured to bake the substrate 613 to a target temperature. For example, the bake module 625 can bake and stabilize the substrate 613 at 32° C. or 90° C. As another example, the bake module 625 can bake the substrate 613 with a shape control material (e.g., a heat sensitive material) formed thereon using a pattern of heat, which corresponds to a bow measurement of the substrate 613, to correct or modify an internal stress of the shape control layer.

In some embodiments, the modules 623-628 included within the treatment stage 620 can also include one or more radiation sources 626 that are configured to project radiation of variable intensities, which correspond to the bow measurement of the substrate 613, onto different regions of the shape control material. The modules 623-628 can also include a plurality of heating units 627, which can be installed on a wafer mount used to support a wafer. The heating units 627 can have an arrangement corresponding to a certain pattern of heat and generate different temperature ranges of heat, such that the wafer mount has a plurality of heating zones that correspond to the certain pattern of heat. Accordingly, the shape control material can be heated in different regions, which correspond to the certain pattern of heat, and its stresses in the different regions can be modified to become compressive, neutral or tensile.

The wafer processing system 600 further includes a controller 660. The controller 660 can be a computer processor, which is located within the wafer processing system 600 or located remotely, but in communication with various components of the wafer processing system 600, such as the metrology module 623, the film formation module 624, the bake module 625, the radiation source 626 and the heating units 627. In some embodiments, the controller 660 may perform the functions of the controller 270 discussed above.

For example, the controller 660 may control the metrology module 623 to determine a surface profile of a substrate 613 or calculate a bow or warp value for the substrate 613. In some embodiments, the controller 660 may: (a) control the film formation module 624 to form a shape control layer on one side of the substrate 613 (e.g., the backside, frontside or both), (b) control the bake module 625 to differentially bake the substrate 613 with the shape control layer formed thereon using a pattern of heat that corresponds to the bow or warp measurement of the substrate 613, (c) control the radiation source 626 to project radiation of variable intensities, which correspond to the bow or warp measurement of the substrate 613, on different regions of the shape control layer, and/or (d) control the heating units 627 to generate different temperature ranges of heat, which correspond to a certain pattern of heat, to correct or modify the internal stress of the stressor film.

Metrology tools for determining substrate planarity and systems comprising such tools are shown in FIGS. 2 and 6 and described above. The metrology tools disclosed herein use non-contact, laser-scanning technique to determine the planarity a semiconductor substrate. The metrology tools shown in FIGS. 2 and 6 improve upon conventional bow measurement tools by using a fixed optical system to measure the slope of the substrate surface at multiple points across the substrate surface as the semiconductor substrate is moved in at least one direction (e.g., an x and/or y direction). The slope measurements obtained across the substrate surface are then combined to determine a surface profile of the semiconductor substrate, or used to calculate the amount of bow or warp attributed to the substrate surface.

FIG. 7 illustrates one embodiment of a method 700 that utilizes the non-contact, laser scanning techniques described herein to determine a surface profile of a semiconductor substrate. It will be recognized that the embodiment shown in FIG. 7 is merely exemplary and additional methods may utilize the techniques described herein. Further, additional processing steps may be added to the method shown in the FIG. 7 as the steps described are not intended to be exclusive. Moreover, the order of the steps is not limited to the order shown in the figure as different orders may occur and/or various steps may be performed in combination or at the same time.

The method 700 shown in FIG. 7 begins by moving a substrate having a substrate surface in at least one direction (in step 710) and directing a coherent light beam onto the substrate surface (in step 720). As described above and shown in FIGS. 2 and 4, the coherent light beam may be scanned across the substrate surface as the substrate moves in the at least one direction (e.g., the x and/or y direction). In some embodiments, the substrate may be supported in a horizontal orientation, or a vertical orientation, while the coherent light beam is scanned across the surface of the substrate.

The method 700 further includes detecting light reflected from the substrate surface (in step 730) and generating a plurality of output data (in step 740) as the substrate moves in the at least one direction in step 710. The light reflected from the substrate surface is detected in step 730 at a plurality of measurement points spaced across the substrate surface. The plurality of output data generated in step 740 corresponds to the detected light reflected from the substrate surface at the plurality of measurement points.

The method 700 further includes converting the plurality of output data into a plurality of slope data points (in step

750), where each slope data point corresponds to a slope of the substrate surface at a different measurement point on the substrate, and determining the surface profile of the substrate using the plurality of slope data points (in step 760). In some embodiments, step 760 may further include calculating a bow value and/or a warp value corresponding to the substrate, depending on the scan method used to obtain the output data from the substrate surface.

In some embodiments, the method 700 may move the substrate in a first direction to scan the coherent light beam across the surface of the substrate in a line, which passes through a center point on the surface of the substrate (in step 710), as shown for example in FIG. 4A. In such embodiments, the method 700 may detect light reflected from a first set of measurement points, which are spaced across the surface of the substrate and located along the line (in step 730), and generate a first set of output data corresponding to the reflected light detected from the first set of measurement points (in step 740). The method 700 may convert the first set of output data into a first set of slope data points, each corresponding to a slope of the surface of the substrate at a different measurement point located along the line (in step 750), and determine the surface profile of the substrate (in step 760) by calculating a bow value corresponding to the substrate using the first set of slope data points.

In some embodiments, the method 700 may move the substrate in a first direction and a second direction orthogonal to the first direction to scan the coherent light beam across the surface of the substrate in a two-dimensional (2D) array (in step 710), as shown for example in FIG. 4B. In such embodiments, the method 700 may detect light reflected from a second set of measurement points, which are spaced across the surface of the substrate and located within the 2D array (in step 730), and generate a second set of output data corresponding to the reflected light detected from the second set of measurement points (in step 740). The method 700 may convert the second set of output data into a second set of slope data points, each corresponding to a slope of the surface of the substrate at a different measurement point within the 2D array (in step 750), and determine the surface profile of the substrate (in step 760) by calculating at least one of a bow value and a warp value corresponding to the substrate using the second set of slope data points.

Improved systems, metrology tools and methods for determining the planarity of a semiconductor substrate are described in various embodiments. The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems, metrology tools and methods described herein will be apparent to those skilled in the art in view of this description. It will be recognized, therefore, that the systems, metrology tools and methods described herein are not limited to only the examples provided in the present disclosure. It is to be understood that the forms of the systems, metrology tools and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A metrology tool for determining a surface profile of a substrate, the metrology tool comprising:
   a wafer mount configured to support the substrate;
   at least one movable stage coupled to move the wafer mount in at least one direction;
   an optical system comprising a plurality of components, which remain stationary at fixed positions while the at least one movable stage moves the wafer mount and the substrate supported thereon in the at least one direction, wherein plurality of components comprises:
   a beamsplitter coupled to redirect a coherent light beam onto a surface of the substrate, wherein as the wafer mount moves in the at least one direction, the coherent light beam redirected by the beamsplitter is reflected from the surface of the substrate at each of a plurality of measurement points and transmitted back through the beamsplitter as reflected light;
   a lens coupled to receive the reflected light transmitted through the beamsplitter, wherein as the wafer mount moves in the at least one direction, the reflected light from each of the plurality of measurement points is transmitted through the lens: (a) without redirection if a slope of the surface of the substrate is zero at a given measurement point, and (b) with redirection if the slope of the surface of the substrate is not zero at the given measurement point; and
   an optical sensor coupled to receive the reflected light transmitted through the lens, wherein as the wafer mount moves in the at least one direction, the optical sensor detects a position of the reflected light from each of the plurality of measurement points incident on the optical sensor, and generates a plurality of output data corresponding to the detected positions of the reflected light; and
a processing device coupled to receive the plurality of output data from the optical system, wherein the processing device executes program instructions stored in non-transitory memory to:
   convert the plurality of output data into a plurality of slope data points, each corresponding to a slope of the surface of the substrate at a different measurement point on the surface of the substrate; and
   combine the plurality of slope data points to determine a surface profile of the substrate.

2. The metrology tool of claim 1, wherein the plurality of components further comprise
   a laser light source configured to emit the coherent light beam; and
   wherein the beamsplitter is coupled to receive the coherent light beam emitted by the laser light source and configured to redirect the coherent light beam onto the surface of the substrate.

3. The metrology tool of claim 1, wherein the output data corresponding to each detected position of the reflected light corresponds to: (a) a zero slope position if the slope of the surface of the substrate is zero at a given measurement point, and (b) a position displaced from the zero slope position if the slope of the surface of the substrate is not zero at the given measurement point.

4. The metrology tool of claim 3, wherein the processing device executes the program instructions stored in non-transitory memory to:
   convert the output data corresponding to each detected position of the reflected light into a slope data point that corresponds to the slope of the surface of the substrate at each corresponding measurement point.

5. The metrology tool of claim 1, wherein the at least one movable stage is configured to move the wafer mount in the at least one direction to scan the coherent light beam across the surface of the substrate.

6. The metrology tool of claim 5, wherein the substrate is supported by the wafer mount in a horizontal orientation, or a vertical orientation, while the coherent light beam is scanned across the surface of the substrate.

7. The metrology tool of claim 1, wherein the at least one movable stage is configured to move the wafer mount in a first direction to scan the coherent light beam across the surface of the substrate in a line, which passes through a center point on the surface of the substrate.

8. The metrology tool of claim 7, wherein as the coherent light beam is scanned across the surface of the substrate in the line, the optical system: (a) detects light reflected from a first set of measurement points, which are spaced across the surface of the substrate and located along the line, and (b) generates a first set of output data corresponding to the reflected light detected from the first set of measurement points.

9. The metrology tool of claim 8, wherein the processing device is coupled to receive the first set of output data and configured to execute the program instructions stored in the non-transitory memory to:
  convert the first set of output data into a first set of slope data points, each corresponding to a slope of the surface of the substrate at a different measurement point located along the line; and
  calculate a bow value corresponding to the substrate using the first set of slope data points.

10. The metrology tool of claim 1, wherein the at least one movable stage is configured to move the wafer mount in a first direction and a second direction orthogonal to the first direction to scan the coherent light beam across the surface of the substrate in a two-dimensional (2D) array.

11. The metrology tool of claim 10, wherein as the coherent light beam is scanned across the surface of the substrate in the 2D array, the optical system: (a) detects light reflected from a second set of measurement points, which are spaced across the surface of the substrate and located within the 2D array, and (b) generates a second set of output data corresponding to the reflected light detected from the second set of measurement points.

12. The metrology tool of claim 11, wherein the processing device is coupled to receive the second set of output data and configured to execute the program instructions stored in the non-transitory memory to:
  convert the second set of output data into a second set of slope data points, each corresponding to a slope of the surface of the substrate at a different measurement point within the 2D array; and
  calculate at least one of a bow value and a warp value corresponding to the substrate using the second set of slope data points.

13. A method of determining a surface profile of a substrate, the method comprising:
  moving the substrate in at least one direction, the substrate having a substrate surface;
  directing a coherent light beam onto the substrate surface via a beamsplitter, wherein as the substrate moves in the at least one direction, the coherent light beam is scanned across the substrate surface, reflected from the surface of the substrate at each of a plurality of measurement points spaced across the substrate surface and transmitted back through the beamsplitter as reflected light;
  transmitting the reflected light through a lens, wherein as the substrate moves in the at least one direction, the reflected light from each of the plurality of measurement points is transmitted through the lens: (a) without redirection if a slope of the surface of the substrate is zero at a given measurement point, and (b) with redirection if the slope of the surface of the substrate is not zero at the given measurement point;
  detecting the reflected light transmitted through the lens, wherein the reflected light is detected at each of the plurality of measurement points as the substrate moves in the at least one direction;
  generating a plurality of output data, wherein the plurality of output data corresponds to the reflected light detected at each of the plurality of measurement points as the substrate moves in the at least one direction;
  converting the plurality of output data into a plurality of slope data points, wherein each slope data point corresponds to a slope of the substrate surface at a different measurement point on the substrate; and
  determining the surface profile of the substrate using the plurality of slope data points.

14. The method of claim 13, further comprising supporting the substrate in a horizontal orientation, or a vertical orientation, while the coherent light beam is scanned across the substrate surface.

15. The method of claim 13, wherein said moving the substrate in the at least one direction comprises:
  moving the substrate in a first direction to scan the coherent light beam across the surface of the substrate in a line, which passes through a center point on the substrate surface.

16. The method of claim 15, wherein said detecting the reflected light comprises detecting the reflected light from a first set of measurement points, which are spaced across the substrate surface and located along the line, and wherein said generating the plurality of output data comprises generating a first set of output data corresponding to the reflected light detected from the first set of measurement points.

17. The method of claim 16, wherein said converting the plurality of output data comprises converting the first set of output data into a first set of slope data points, each corresponding to a slope of the substrate surface at a different measurement point located along the line, and wherein said determining the surface profile of the substrate comprises calculating a bow value corresponding to the substrate using the first set of slope data points.

18. The method of claim 13, wherein said moving the substrate in the at least one direction comprises:
  moving the substrate in a first direction and a second direction orthogonal to the first direction to scan the coherent light beam across the substrate surface in a two-dimensional (2D) array.

19. The method of claim 18, wherein said detecting the reflected light comprises detecting the reflected light from a second set of measurement points, which are spaced across the substrate surface and located within the 2D array, and wherein said generating the plurality of output data comprises generating a second set of output data corresponding to the reflected light detected from the second set of measurement points.

20. The method of claim 19, wherein said converting the plurality of output data comprises converting the second set of output data into a second set of slope data points, each corresponding to a slope of the substrate surface at a different measurement point within the 2D array, and wherein said determining the surface profile of the substrate comprises calculating at least one of a bow value and a warp value corresponding to the substrate using the second set of slope data points.

* * * * *